(12) United States Patent
Nitta et al.

(10) Patent No.: US 7,192,687 B2
(45) Date of Patent: Mar. 20, 2007

(54) POSITIVE RESIST COMPOSITION AND METHOD OF FORMING RESIST PATTERN USING SAME

(75) Inventors: Kazuyuki Nitta, Kawasaki (JP); Waki Ohkubo, Kawasaki (JP); Satoshi Shimatani, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 224 days.

(21) Appl. No.: 10/931,958

(22) Filed: Sep. 1, 2004

(65) Prior Publication Data

US 2005/0079445 A1 Apr. 14, 2005

(30) Foreign Application Priority Data

Sep. 5, 2003 (JP) ............................. 2003-314365
Apr. 14, 2004 (JP) ............................. 2004-119495

(51) Int. Cl.
*G03F 7/40* (2006.01)
*G03F 7/004* (2006.01)

(52) U.S. Cl. .................................... 430/270.1; 430/326

(58) Field of Classification Search ...................... None
See application file for complete search history.

(56) References Cited

U.S. PATENT DOCUMENTS 4,491,628 A    1/1985  Ito et al.

FOREIGN PATENT DOCUMENTS

| EP | 0 401 499 A1 * | 12/1990 |
|----|----|----|
| EP | 0733952 A1 * | 9/1996 |
| JP | 02-27660 | 6/1990 |
| JP | 04-287044 | 10/1992 |
| JP | 05-040342 | 2/1993 |
| JP | 05-313372 | 11/1993 |
| JP | 06-130670 | 5/1994 |
| JP | 06-287163 | 10/1994 |
| JP | 07-285918 | 10/1995 |
| JP | 08-193052 | 7/1996 |
| JP | 08-193054 | 7/1996 |
| JP | 08-193055 | 7/1996 |
| JP | 08-245515 | 9/1996 |
| JP | 09-07720 | 3/1997 |
| JP | 10-268508 | 10/1998 |
| JP | 2001-142217 | 5/2001 |
| TW | 285719 | 9/1996 |

OTHER PUBLICATIONS

Matsumoto et al, "Hydrogenated Poly(p-vinylphenol) for Microlithography", Ind. Eng. CHem. Res. 1996, pp. 2414-2419.*

Lange's Handbook of Chemistry (15th Ed), McGraw-Hill, 1999, Secion 1, 1.1 to 1.1.2.2, edited by Dean, J.A.*

Chatzichristidi et al, "partially hydrogenated poly(vinly phenol) based photoresist for near UV, high aspect raito machining". K/Va/c Sco/ Tecjmp;/ B 2- 96), Nov./Dec. 2002 pp. 2968-2972.*

* cited by examiner

*Primary Examiner*—Cynthia Hamilton
(74) *Attorney, Agent, or Firm*—Knobbe, Martens, Olson and Bear, LLP

(57) ABSTRACT

A positive resist composition capable of realizing an improvement in resolution, a reduction in LER, and a reduction in the level of defects, as well as a method of forming a resist pattern. This composition and method provide:

a positive resist composition comprising a resin component (A) containing a structural unit (a1) derived from an (α-methyl)hydroxystyrene, represented by a general formula (1) shown below, and a structural unit (a2) represented by a general formula (2) shown below, wherein the solubility rate of the component (A) in a 2.38% by weight aqueous solution of TMAH (tetramethylammonium hydroxide) is within a range from 100 to 1000 Å/second, as well as a method of forming a resist pattern that uses such a composition;

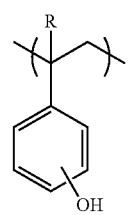

(1)

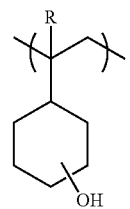

(2)

(wherein in the general formulas (1) and (2), R represents a hydrogen atom or a methyl group).

15 Claims, No Drawings

POSITIVE RESIST COMPOSITION AND METHOD OF FORMING RESIST PATTERN USING SAME

BACKGROUND OF THE INVENTION

1. Field of the Invention

The present invention relates to positive resist composition and a method of forming a resist pattern using the resist composition.

Priority is claimed on Japanese Patent Application No. 2003-314365, filed Sep. 5, 2003, and Japanese Patent Application No. 2004-119495, filed Apr. 14, 2004, the contents of which are incorporated herein by reference.

2. Description of Related Art

In recent years, the level of integration of semiconductor elements has continued to increase.

A multitude of chemically amplified resists that contribute to improved levels of semiconductor element integration have already been proposed.

Japanese Examined Patent Application, Second Publication No. Hei 2-27660 (patent reference 1) discloses a two-component resist comprising, as the principal components, an acid generator, and a base resin in which the hydrogen atoms of the hydroxyl groups of a polyhydroxystyrene, which displays excellent transparency relative to KrF excimer laser light, have been substituted with acid dissociable, alkali dissolution inhibiting groups such as t-boc (tert-butoxycarbonyl) groups.

An outline of the theory associated with resist pattern formation using the type of resist proposed in the above published examined patent application is presented below.

By incorporating t-boc groups within the base resin, the alkali solubility of the base resin is reduced significantly in comparison with the equivalent polyhydroxystyrene containing no t-boc groups. This type of base resin is then mixed with an acid generator, and when the composition is subjected to selective exposure, the acid generated from the acid generator within the exposed portions of the composition causes the t-boc groups to dissociate, thus generating a polyhydroxystyrene, and converting the exposed portions to an alkali soluble state.

Furthermore, (1) Japanese Unexamined Patent Application, First Publication No. Hei 4-287044 (patent reference 2), (2) Japanese Unexamined Patent Application, First Publication No. Hei 5-40342 (patent reference 3), (3) Japanese Unexamined Patent Application, First Publication No. Hei 5-313372 (patent reference 4), (4) Japanese Unexamined Patent Application, First Publication No. Hei 6-130670 (patent reference 5), and (5) Japanese Unexamined Patent Application, First Publication No. 2001-142217 (patent reference 6) propose three-component chemically amplified resist compositions comprising ($\alpha$) a novolak resin as the base resin component, ($\beta$) an acid generator, and ($\gamma$) a compound which under the action of acid undergoes dissociation of an acid dissociable, dissolution inhibiting group, thus generating an organic carboxylic acid (namely, a compound in which a carboxyl group has been substituted with an acid dissociable, dissolution inhibiting group).

Patent Reference 1
Japanese Examined Patent Application, Second Publication No. Hei 2-27660
Patent Reference 2
Japanese Unexamined Patent Application, First Publication No. Hei 4-287044
Patent Reference 3
Japanese Unexamined Patent Application, First Publication No. Hei 5-40342
Patent Reference 4
Japanese Unexamined Patent Application, First Publication No. Hei 5-313372
Patent Reference 5
Japanese Unexamined Patent Application, First Publication No. Hei 6-130670
Patent Reference 6
Japanese Unexamined Patent Application, First Publication No. 2001-142217
Patent Reference 7
Japanese Unexamined Patent Application, First Publication No. Hei 10-268508

However, in the technology disclosed in the above patent reference 1, the alkali solubility of the base resin following selective exposure merely reverts to the inherent alkali solubility of the polyhydroxystyrene as the t-boc groups dissociate under the effect of the exposure, and alkali solubility exceeding this level cannot be obtained. Accordingly, the resulting resolution is not entirely satisfactory.

In the three component resists disclosed in (1) to (5) above [patent references (2) through (6)], the action of the acid generated by exposure causes the generation of a carboxylic acid from the component ($\gamma$), and the existence of this carboxylic acid enables an alkali solubility of the resist to be achieved that exceeds the inherent alkali solubility of the component ($\alpha$). Accordingly, the resists display excellent contrast between the exposed portions and the unexposed portions, although the transparency is poor unless the resist film thickness is kept very thin, and the resolution is not entirely satisfactory.

Furthermore, as the level of integration of semiconductor elements continues to rise, resist patterns must not only display levels of resolution capable of resolving the ultra fine patterns targeted by the use of short wavelength light sources such as KrF excimer lasers, but must also enable reductions in LER (line edge roughness) and other defects.

The patent reference 7 listed above proposes a resist material that uses a resin comprising hydroxystyrene units and cyclohexanol units, which has been subjected to cross linking using ether linkages. However, this resist material suffers from defects, and is not particularly satisfactory.

LER describes non-uniform irregularities along the side walls of lines. Defects refer to general problems such as scum and resist pattern irregularities detected by inspecting the developed resist pattern from directly overhead using a surface defect inspection apparatus, such as that manufactured by KLA Tencor Corporation (brand name "KLA").

SUMMARY OF THE INVENTION

The present invention takes the problems described above into consideration, with an object of providing a positive resist composition capable of realizing an improvement in resolution, a reduction in LER, and a reduction in the level of defects, as well as a method of forming such a resist pattern.

In order to achieve the above object, the present invention employs the aspects described below.

Namely, a positive resist composition according to the present invention comprises a resin component (A) containing a structural unit (a1) derived from an ($\alpha$-methyl)hydroxystyrene, represented by a general formula (1) shown below, and a structural unit (a2) represented by a general formula (2) shown below, wherein the solubility rate of the component (A) in a 2.38% by weight aqueous solution of TMAH (tetramethylammonium hydroxide) is within a range from 100 to 1000 Å/second.

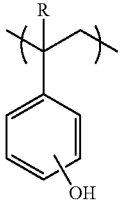

(1)

(wherein, R represents a hydrogen atom or a methyl group)

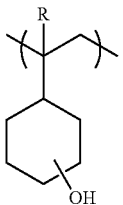

(2)

(wherein, R represents a hydrogen atom or a methyl group)

A method of forming a resist pattern according to the present invention uses the positive resist composition described above.

In this application, including the appended claims, the term "(α-methyl)hydroxystyrene" describes both α-methyl-hydroxystyrene and hydroxystyrene.

A "structural unit derived from an (α-methyl)hydroxystyrene" is represented clearly by the above general formula (1), and refers to a structural unit formed by cleavage of the ethylene based double bond of the (α-methyl)hydroxystyrene.

The term "structural unit" refers to a monomer unit that contributes to the formation of a polymer.

Furthermore, the term "weight average molecular weight" refers to the polystyrene equivalent weight average molecular weight determined by gel permeation chromatography (GPC).

"Defects" refer to general problems such as scum and resist pattern irregularities detected by inspecting a developed resist pattern from directly overhead using a surface defect inspection apparatus, such as that manufactured by KLA Tencor Corporation (brand name "KLA").

The present invention enables the provision of a positive resist composition that is capable of realizing an improvement in resolution, a reduction in LER, and a reduction in the level of defects, as well as a method of forming such a resist pattern.

DETAILED DESCRIPTION OF THE INVENTION

[Positive Resist Composition]

Component (A): A resin component containing a structural unit (a1) derived from an (α-methyl)hydroxystyrene, represented by the above general formula (1), and a structural unit (a2) represented by the above general formula (2).

By employing the component (A) within a positive resist composition according to the present invention, the resolution can be improved, LER can be reduced, and the level of defects can also be reduced.

Structural Unit (a1)

In the general formula (1) shown above, the bonding position of the hydroxyl group may be any one of the ortho, meta and para positions, and although there are no particular restrictions, the para position is preferred.

The group R represents a hydrogen atom or a methyl group, and although either is acceptable, a hydrogen atom is preferred.

The structural unit (a1) typically accounts for 40 to 95 mol %, and preferably from 50 to 90 mol %, and even more preferably from 50 to 80 mol %, and most preferably from 55 to 65 mol %, of the component (A). Ensuring that the proportion of the structural unit (a1) falls within the above range facilitates better control of the solubility rate. Furthermore, a proportion within the above range enables a more effective manifestation of the synergistic effect with the structural unit (a2).

Structural Unit (a2)

In the general formula (2) shown above, the bonding position of the hydroxyl group may be any one of the ortho, meta and para positions, and although there are no particular restrictions, the para position is preferred.

The group R represents a hydrogen atom or a methyl group, and although either is acceptable, a hydrogen atom is preferred.

The structural unit (a2) typically accounts for 5 to 60 mol %, and preferably from 10 to 50 mol %, and even more preferably from 20 to 50 mol %, and most preferably from 35 to 45 mol %, of the component (A). Ensuring that the proportion of the structural unit (a2) falls within the above range facilitates better control of the solubility rate. Furthermore, a proportion within the above range enables a more effective manifestation of the synergistic effect with the structural unit (a1). Ensuring that the proportion of the structural unit (a2) is at least 5 mol % enables better pattern formation. By ensuring that the proportion does not exceed 60 mol %, the solubility of the exposed portions can be maximized, enabling a favorable improvement in the sensitivity. If a resist composition is produced using a resin formed solely from the structural unit (a1) (namely, a polyhydroxystyrene), then even when combined with the component (B) and the component (C) described below, the formation of ultra fine patterns such as L&S (line and space) patterns of no more than 300 nm:300 nm is very difficult. Furthermore, in those cases where the component (A) of the present invention is produced by hydrogenation of a polyhydroxystyrene, in the manner described below, the proportion of the structural unit (a2) within the resin is equivalent to the hydrogenation rate.

Solubility Rate

The solubility rate of the component (A) in a 2.38% by weight aqueous solution of TMAH (tetramethylammonium hydroxide) is typically within a range from 100 to 1000 Å/second, and is preferably from 150 to 900 Å/second.

By ensuring a comparatively low solubility rate of no more than 1000 Å/second, the resolution of the resist composition can be improved. It is surmised that this improvement is due to the fact that the variation in solubility caused by the dissociation of the acid dissociable, dissolution inhibiting group from the aforementioned component (C) is able to increase the contrast at the interface between the exposed portions that undergo dissolution in the alkali developing solution, and the unexposed portions that remain insoluble in the alkali developing solution. Furthermore, reductions in both LER and the level of defects are also achieved.

Ensuring that the solubility rate is at least 100 Å/second enables the composition to be dissolved in an organic solvent to generate a resist.

Conventionally used resins, in which the hydroxyl groups of a polyhydroxystyrene are protected with acid dissociable, dissolution inhibiting groups such as tert-butyl groups, tert-butoxycarbonyl groups or acetal groups, are designed to be extremely insoluble in the alkali developing solution, and the solubility rate is typically in the order of 5 Å/second. These types of resins are unable to achieve the object of the present invention.

The solubility rate is a value determined using the method described below.

First, a solution comprising the component (A) dissolved in an organic solvent is applied to the surface of a silicon wafer, and the organic solvent is then removed by heat treatment [a prebake (PB)], thus forming a resin film.

The organic solvent can be appropriately selected from the conventional solvents described below that are typically used with positive resist compositions. Furthermore, the concentration of the component (A) can be set to a similar concentration to that used in a positive resist composition, typically 20% by weight for example.

Subsequently, following measurement of the thickness of the resin film, the wafer is immersed in a 2.38% by weight aqueous solution of TMAH at 23° C. The time taken for the resin film to dissolve completely is measured, and this value is used to determine the film thinning rate of the resin film per unit of time (Å/second).

The film thinning rate of the resin film determined in this manner represents the solubility rate of the component (A).

The component (A) can be produced by first producing a polyhydroxystyrene resin via a conventional polymerization of a monomer (a hydroxystyrene monomer) that generates the structural units (a1), and then conducting a hydrogenation treatment. By conducting the hydrogenation treatment, a portion of the structural units (a1) are converted to structural units (a2).

By appropriate adjustment of the conditions used for the hydrogenation treatment, the ratio between the structural units (a1) and the structural units (a2) within the component (A) (namely, the hydrogenation rate) can be controlled.

The hydrogenation treatment can employ the types of methods that are widely used industrially. For example, a nickel catalyst or the like can be used, and the treatment conducted at a temperature of 100 to 200° C. The hydrogenation rate can be confirmed by GPC (gel permeation chromatography). Because the hydrogenation rate varies depending on conditions such as the temperature and the pressure, these conditions should be set so as to generate the desired ratio between the two different structural units (a1) and (a2).

The component (A) may also comprise other copolymerizable structural units in addition to the structural units (a1) and (a2), provided the resulting component (A) displays a solubility rate that still satisfies the numerical range described above, although the combination of the structural units (a1) and (a2) preferably accounts for at least 80 mol %, and even more preferably 90 mol % or greater, and most preferably 100 mol %, of the component (A).

The ratio between the structural units (a1) and the structural units (a2) is a very important factor in ensuring that the component (A) displays the specified solubility rate. However, the values of the weight average molecular weight (Mw) and the polydispersity (Mw/Mn) should also preferably be considered. The weight average molecular weight of the component (A) is preferably within a range from 3000 to 25,000, and even more preferably from 5000 to 20,000, and most preferably from 7000 to 15,000. The polydispersity is typically no more than 2.5, and preferably no more than 2.0, and even more preferably no more than 1.5, and most preferably 1.2 or less. By ensuring that the weight average molecular weight and the polydispersity fall within the above respective ranges, even if the proportion of the structural unit (a2) becomes quite large, the quantity of products that are insoluble in the developing solution remains minimal, and the resist composition displays excellent resolution, and reduced levels of LER and defects. For resins in which the polydispersity value is high, the low molecular weight materials undergo hydrogenation preferentially. As a result, low molecular weight materials with high proportions of the structural unit (a2) are generated, and these materials are insoluble in the alkali developing solution, and can potentially cause problems.

The component (A) may be either a single resin, or a combination of 2 or more different resins.

The proportion of the component (A) within the positive resist composition can be adjusted appropriately in accordance with the targeted resist film thickness, and is typically sufficient to generate a solid fraction concentration within a range from 8 to 25% by weight, and even more preferably from 10 to 20% by weight.

The positive resist composition may also comprise other resins in addition to the component (A), such as the types of polyhydroxystyrene resins and (meth)acrylate resins typically used in positive resist compositions, although of the total resin component within the positive resist composition, the component (A) typically accounts for at least 80% by weight, and preferably 90% by weight or greater, and most preferably 100% by weight.

The positive resist composition of the present invention preferably comprises a component (A) as described above, an acid generator component (B) that generates acid on exposure, and a compound (C), which contains at least one acid dissociable, dissolution inhibiting group, and which under the action of the acid generated from the component (B), undergoes dissociation of the dissolution inhibiting group, thus generating an organic carboxylic acid.

Component (B): An acid Generator Component that Generates Acid on Exposure

The component (B) is a so-called acid generator. A large number of acid generators are already known, including onium salts such as iodonium salts and sulfonium salts, oxime sulfonates, bisalkyl or bisaryl sulfonyl diazomethanes, nitrobenzyl sulfonates, iminosulfonates, and disulfones. There are no particular restrictions on the acid generator, and any of the above known materials can be used, although in the present invention, in order to ensure a favorable dissociation within the component (C) in the presence of acid, onium salts with a fluorinated alkylsulfonate ion as the anion, which generate a strong acid, are particularly desirable.

Examples of suitable onium salts include salts in which the associated cation is either a diphenyliodonium, triphenylsulfonium, di-lower alkyl monophenylsulfonium, or lower alkyl cyclohexyl-2-oxocylcohexylsulfonium ion, which may be either unsubstituted, or substituted with a lower alkyl group such as a methyl group, ethyl group, propyl group, n-propyl group or tert-butyl group, or with a lower alkoxy group such as a methoxy group or ethoxy group.

The anion is a fluoroalkylsulfonate ion in which either a portion of, or all of, the hydrogen atoms of the alkyl group have been fluorinated. Because the strength of the resulting sulfonic acid falls as the number of carbon atoms increases, or as the fluorination rate (the proportion of fluorine atoms within the alkyl group) decreases, fluorinated alkylsulfonates with an alkyl group of 1 to 10 carbon atoms in which all of the hydrogen atoms have been fluorinated are preferred.

These types of onium salts are represented by the general formulas (III), (IV), (V) and (VI) shown below.

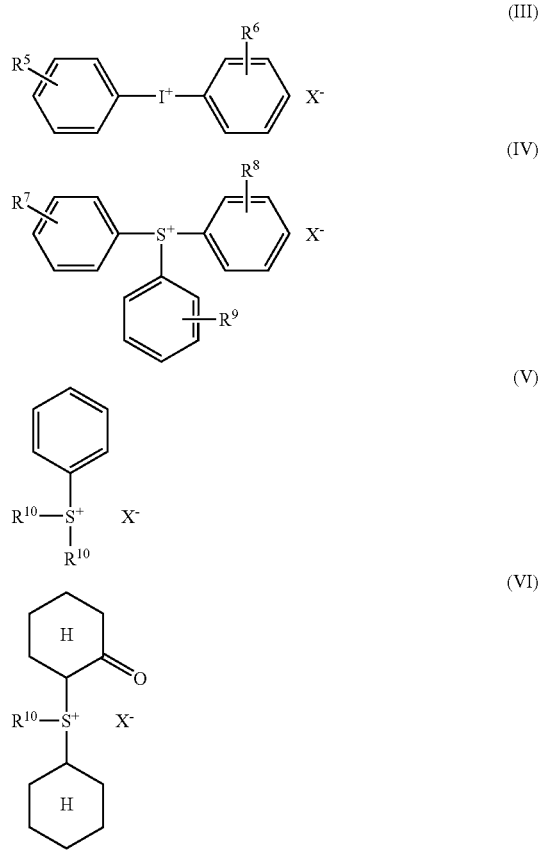

(wherein, $R^5$, $R^6$, $R^7$, $R^8$ and $R^9$ each represent, independently, a hydrogen atom, an alkyl group of 1 to 4 carbon atoms, or an alkoxy group of 1 to 2 carbon atoms, $R^{10}$ represents an alkyl group of 1 to 4 carbon atoms, and $X^-$ represents a fluoroalkylsulfonate ion). Specific examples include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate or nonafluorobutanesulfonate; tri(4-methylphenyl)sulfonium trifluoromethanesulfonate or nonafluorobutanesulfonate; tri(4-methoxyphenyl)sulfonium trifluoromethanesulfonate or nonafluorobutanesulfonate; dimethylphenylsulfonium trifluoromethanesulfonate or nonafluorobutanesulfonate; and methylcyclohexyl-2-oxocyclohexylsulfonium trifluoromethanesulfonate or nonafluorobutanesulfonate.

Of the above salts, iodonium or sulfonium trifluoromethanesulfonates or nonafluorobutanesulfonates represented by the general formulas (III) and (IV) are preferred. These salts can be used singularly, or in combinations of two or more different salts.

The quantity added of the component (B) is preferably within a range from 0.5 to 20 parts by weight, and even more preferably from 1 to 15 parts by weight, per 100 parts by weight of the component (A). Quantities within this range allow pattern formation, while enabling the ready formation of a uniform resist solution.

Component (C): A compound which contains at least one acid dissociable, dissolution inhibiting group, and which under the action of the acid generated from the component (B), undergoes dissociation of the dissolution inhibiting group, thus generating an organic carboxylic acid.

There are no particular restrictions on the component (C), which can use one of the multitude of compounds already proposed in the background art of (1) through (4) above, or in Japanese Unexamined Patent Application, First Publication No. Hei 6-287163, Japanese Unexamined Patent Application, First Publication No. Hei 7-285918, Japanese Unexamined Patent Application, First Publication No. Hei 8-193052, Japanese Unexamined Patent Application, First Publication No. Hei 8-193054, Japanese Unexamined Patent Application, First Publication No. Hei 8-193055, Japanese Unexamined Patent Application, First Publication No. Hei 8-245515, or Japanese Unexamined Patent Application, First Publication No. Hei 9-77720.

The acid dissociable, dissolution inhibiting group may be appropriately selected from those groups already proposed for use in chemically amplified positive resists. These groups can be classified into two main types: groups in which a phenolic hydroxyl group is protected with an acid dissociable, dissolution inhibiting group, and groups in which a carboxyl group is protected with an acid dissociable, dissolution inhibiting group.

Specific examples of the acid dissociable, dissolution inhibiting group include tertiary alkyloxycarbonyl groups such as tert-butyloxycarbonyl groups and tert-amyloxycarbonyl groups; tertiary alkyloxycarbonylalkyl groups such as tert-butyloxycarbonylmethyl groups and tert-butyloxycarbonylethyl groups; tertiary alkyl groups such as tert-butyl groups and tert-amyl groups; cyclic ether groups such as tetrahydropyranyl groups and tetrahydrofuranyl groups; alkoxyalkyl groups such as ethoxyethyl groups and methoxypropyl groups; and 1-alkylcycloalkyl groups including 1-lower alkyl monocycloalkyl groups such as 1-methylcyclohexyl groups and 1-ethylcycloalkyl groups, and 1-lower alkylpolycycloalkyl groups such as 1-methyladamantyl groups and 1-ethyladamantyl groups.

Of these groups, tert-butyloxycarbonyl groups, tert-butyloxycarbonylmethyl groups, tert-butyl groups, tetrahydropyranyl groups, ethoxyethyl groups, 1-methylcyclohexyl groups and 1-ethylcyclohexyl groups are particularly preferred.

Examples of suitable acid dissociable, dissolution inhibiting groups for phenolic hydroxyl groups include all the above acid dissociable, dissolution inhibiting groups excluding the 1-alkylcycloalkyl groups. Examples of suitable acid dissociable, dissolution inhibiting groups for carboxyl groups include all the above acid dissociable, dissolution inhibiting groups excluding the tertiary alkyloxycarbonyl groups.

The component (C) must undergo dissociation of the acid dissociable, dissolution inhibiting group and generate an organic carboxylic acid under the action of the acid generated from the component (B). Accordingly, in those cases where a phenolic compound containing no carboxyl groups is prepared as the component (C) by protecting the phenolic hydroxyl groups with the aforementioned dissolution inhibiting groups, at least one of the phenolic hydroxyl groups must be protected by a carboxylic acid generating group such as a tertiary alkyloxycarbonylalkyl group.

Furthermore, in those cases where a compound containing at least one carboxyl group is prepared as the component (C) by protecting the carboxyl groups with the aforementioned dissolution inhibiting groups, any of the aforementioned dissolution inhibiting groups may be selected.

From the viewpoints of achieving a high level of resolution and a favorable resist pattern shape at low cost, a compound (c-1) with a weight average molecular weight of 100 to 1500 is a particularly preferred form of the component (C).

Examples of preferred forms of this component (c-1) include: (c-1-1) esters of bile acids such as cholic acid, deoxycholic acid, ursocholic acid and lithocholic acid, which contain at least one acid dissociable, dissolution inhibiting group; and (c-1-2) compounds containing from 1 to 6 (and preferably from 2 to 4) substituted or unsubstituted benzene rings and at least one acid dissociable, dissolution inhibiting group, which undergo dissociation of the dissolution inhibiting group to generate an organic carboxylic acid under the action of the acid generated from the component (B). The latter compounds (c-1-2) can be further classified into (i), (ii) and (iii) described below.

(i) Compounds prepared by subjecting a mixture of a phenolic compound such as bisphenol A or a trisphenol, and the tertiary alkyl ester of a halogenated fatty acid such as tert-butyl bromoacetate to a dehydrohalogenation reaction in the presence of an alkali catalyst, thus substituting the hydrogen atom of the phenolic hydroxyl group with a tertiary alkyloxycarbonylalkyl group. In those cases where the compound contains a plurality of hydroxyl groups, the hydroxyl group hydrogen atoms may also be substituted with other acid dissociable, dissolution inhibiting groups, different from the above tertiary alkyloxycarbonylalkyl groups.

(ii) Compounds prepared by subjecting a carboxyl group containing compound such as biphenyldicarboxylic acid, naphthalenedicarboxylic acid or benzophenonedicarboxylic acid to substitution with an acid dissociable, dissolution inhibiting group.

(iii) Compounds prepared by subjecting a compound containing both a carboxyl group and a hydroxyl group, such as 4,4'-bis(4-hydroxyphenyl)pentanoic acid to substitution of the hydrogen atom of either the carboxyl group or the hydroxyl group with an acid dissociable, dissolution inhibiting group. In this case, different acid dissociable, dissolution inhibiting groups can be used for the substitution.

Many phenolic compounds classified within (i) above are already widely known as the phenolic compounds for use in sulfonate esters within non-chemically amplified positive resist compositions, and as sensitivity improvement agents for addition to such positive resist compositions, and any of these known compounds can be used. Specific examples of such compounds include bis(4-hydroxyphenyl)methane, bis (2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl) methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol.

As the carboxyl group containing compound of (ii) above, any of the already known carboxylic acid compounds can be used. Specific examples include cyclohexanecarboxylic acid, benzoic acid, salicylic acid, biphenylpolycarboxylic acid, naphthalene(di)carboxylic acid, naphthalenetriacetic acid, benzoylbenzoic acid, anthracenecarboxylic acid, benzophenonedicarboxylic acid, 1-naphthylacetic acid, and the compound represented by the formula (VII) shown below.

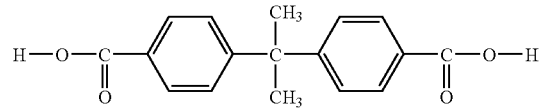

As the compound containing both a carboxyl group and a hydroxyl group of (iii) above, any of the already known compounds can be used. Specific examples include 2,2'-bis (4-hydroxyphenyl)propanoic acid and 4,4'-bis(4-hydroxyphenyl)pentanoic acid.

Particularly preferred forms of the compound (c-1-2) include the compounds represented by the general formula (i) shown below, wherein the hydrogen atom of at least one of the hydroxyl groups or carboxyl groups is substituted with an acid dissociable, dissolution inhibiting group.

These (c-1-2) compounds provide the positive resist composition with a high level of contrast, and enable further improvements in the resist pattern shape and the resolution, and are consequently preferred.

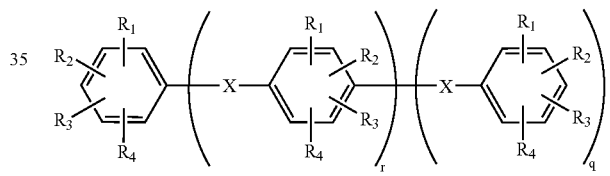

[wherein, $R_1$ to $R_4$ each represent, independently, a hydrogen atom, a straight chain, branched, or cyclic alkyl group of no more than 6 carbon atoms, a lower alkoxy group, a hydroxyl group, a carboxyl group, or an alkyl group that contains a carboxyl group, provided that at least one of the groups $R_1$ to $R_4$ must be a hydroxyl group or a carboxyl group, each X represents, independently, a single bond, —C(O)— or —C($R_5$)($R_6$)—, $R_5$ represents a hydrogen atom or a lower alkyl group, $R_6$ represents a hydrogen atom, a lower alkyl group, a carboxyl group, an alkyl group that contains a carboxyl group, or an aryl group represented by a general formula (ii) shown below (wherein, the groups $R_1$ to $R_4$ within the formula (ii) are as defined above), r represents a number from 0 to 2, and q represents either 0 or 1, although in those cases where q is 0, the group inside the parentheses is a hydrogen atom]

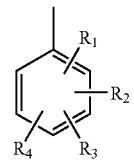

In addition, compounds represented by the general formula (I) shown below, wherein the hydrogen atom of at least one of the hydroxyl groups or carboxyl groups is substituted with an acid dissociable, dissolution inhibiting group are particularly preferred.

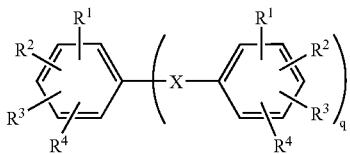

[wherein, $R^1$ to $R^4$ each represent, independently, a hydrogen atom, a straight chain, branched, or cyclic alkyl group of no more than 6 carbon atoms, a lower alkoxy group, a hydroxyl group, a carboxyl group, or an alkyl group that contains a carboxyl group, provided that at least one of the groups $R^1$ to $R^4$ must be a hydroxyl group or a carboxyl group, X represents a single bond, —C(O)— or —C($R^5$)($R^6$)—, $R^5$ represents a hydrogen atom or a lower alkyl group, $R_6$ represents a hydrogen atom, a lower alkyl group, a carboxyl group, an alkyl group that contains a carboxyl group, or an aryl group represented by a general formula (II) shown below (wherein, the groups $R^1$ to $R^4$ within the formula (II) are as defined above), and q represents either 0 or 1, although in those cases where q is 0, the group inside the parentheses is a hydrogen atom]

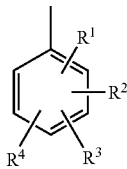

Examples of suitable straight chain, branched, or cyclic alkyl groups of no more than 6 carbon atoms for the above groups $R^1$ to $R^6$ include methyl groups, ethyl groups, n-propyl groups, isopropyl groups, n-butyl groups, sec-butyl groups, tert-butyl groups, cyclopentyl groups, and cyclohexyl groups.

Examples of the above lower alkoxy groups include alkoxy groups of 1 to 5 carbon atoms such as methoxy groups, ethoxy groups and propoxy groups.

Examples of the above lower alkyl groups include alkyl groups of 1 to 5 carbon atoms such as methyl groups, ethyl groups, n-propyl groups, isopropyl groups, n-butyl groups, sec-butyl groups and tert-butyl groups. The above alkyl group that contains a carboxyl group include groups in which a carboxyl group is bonded to an alkylene group of 1 to 10 carbon atoms, and suitable examples of such alkylene groups include methylene groups, ethylene groups, and straight chain or branched propylene groups, butylene groups, hexylene groups, heptylene groups and nonylene groups.

Specific examples of the aforementioned latter component (c-1-2) according to the present invention include the compounds shown below.

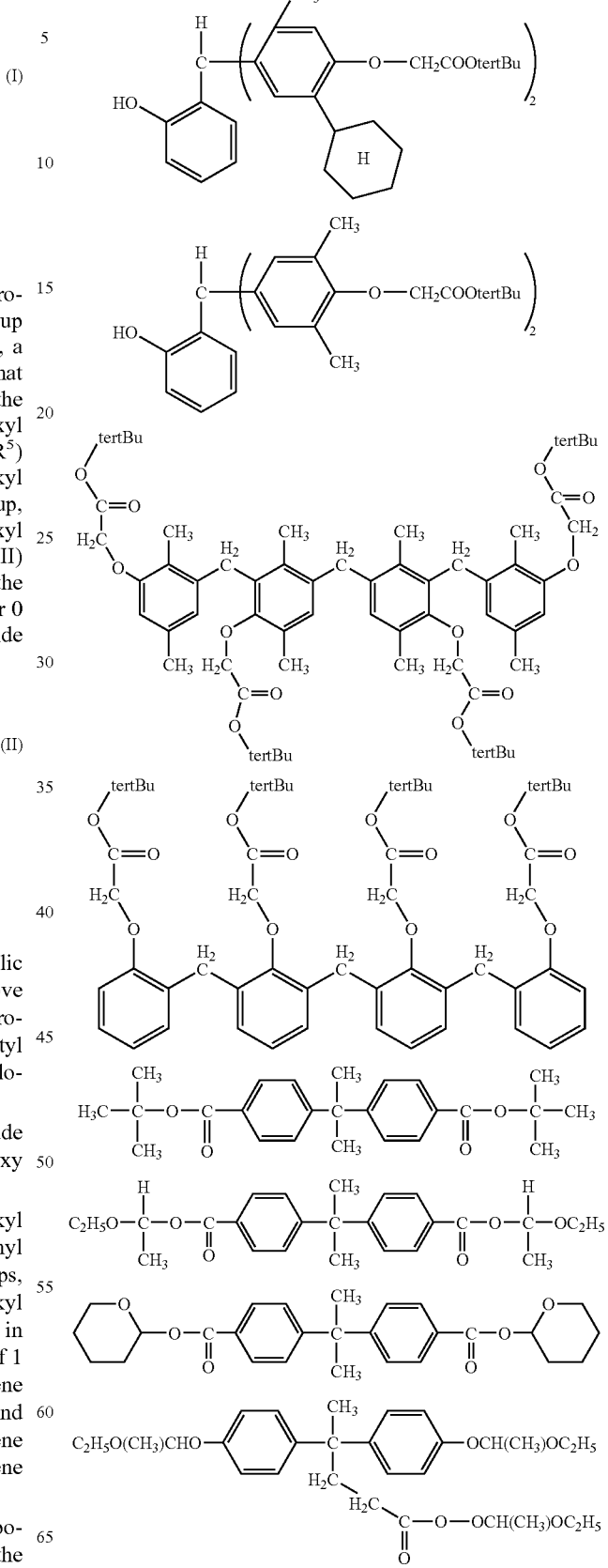

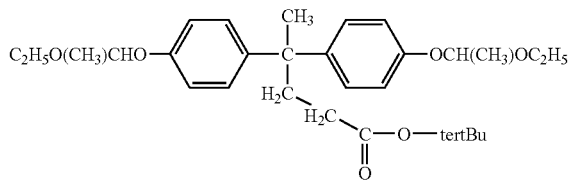

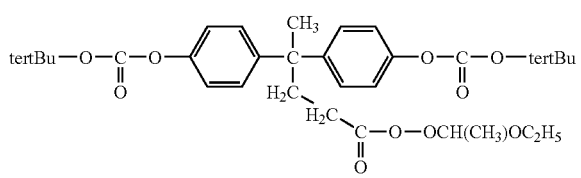

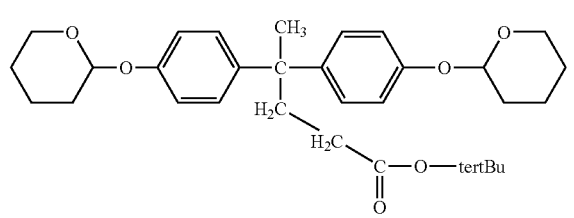

Furthermore, of the (c-1-2) compounds shown above, those represented by the general formula (1A) shown below are preferred,

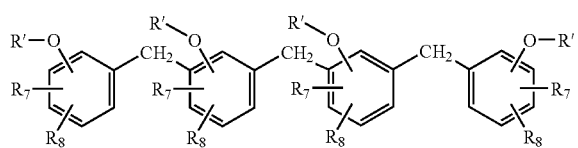

(wherein, each R' represents an acid dissociable, dissolution inhibiting group, and $R_7$ and $R_8$ each represent, independently, a hydrogen atom or a lower alkyl group), and compounds represented by the general formulas (2A) and (1B) shown below are particularly desirable.

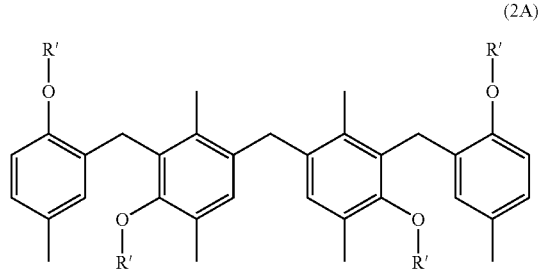

(wherein, each R' represents an acid dissociable, dissolution inhibiting group)

(wherein, each R' represents an acid dissociable, dissolution inhibiting group)

In the general formula (1A) shown above, the lower alkyl groups of $R_7$ and $R_8$ may be either straight chain or branched groups, and preferably contain from 1 to 5 carbon atoms, although methyl groups are particularly desirable.

In the general formulas (1A), (2A) and (1B) shown above, examples of the R' group include the acid dissociable, dissolution inhibiting groups described above. These groups preferably comprise at least one group selected from a group consisting of tertiary alkoxycarbonyl groups, tertiary alkoxycarbonylalkyl groups, tertiary alkyl groups, cyclic ether groups, alkoxyalkyl groups and 1-alkylcycloalkyl groups.

Furthermore, the acid dissociable, dissolution inhibiting group is preferably at least one group selected from a group consisting of a tert-butyloxycarbonyl group, tert-butyloxycarbonylmethyl group, tert-butyl group, tetrahydropyranyl group, ethoxyethyl group, 1-methylcyclohexyl group and 1-ethylcyclohexyl group.

Furthermore, the acid dissociable, dissolution inhibiting group is even more preferably at least one group selected from a group consisting of a tert-butyloxycarbonylmethyl group, tert-butyl group, tetrahydropyranyl group, ethoxyethyl group, 1-methylcyclohexyl group and 1-ethylcyclohexyl group (with a tert-butyloxycarbonylmethyl group being particularly desirable).

Of these, tertiary alkoxycarbonylalkyl groups are preferred, and of such groups, the tert-butyloxycarbonylmethyl group is particularly desirable.

Of the compounds represented by the aforementioned general formulas (2A) and (1B), compounds represented by the general formula (2A) are preferred.

The compound according to the above general formula (2A) in which R' represents a tert-butyloxycarbonylmethyl group is hereafter referred to as "DI".

The quantity added of the component (C) is typically within a range from 1 to 50 parts by weight, and preferably from 5 to 40 parts by weight, per 100 parts by weight of the component (A). In the present invention, combinations of a resin of the component (A), which comprises no acid dissociable, dissolution inhibiting groups and displays a specified solubility rate, and the component (C) are effective in suppressing the level of defects and reducing LER.

A variety of additives may also be added to a positive resist composition of the present invention, as required. Examples of such additives include known nitrogen containing compounds (D) used for improving the time delay (the post exposure stability of the latent image formed by the pattern wise exposure of the resist layer), and organic carboxylic acids, or phosphorus oxo acids or derivatives thereof (E), used for preventing any deterioration in sensitivity, and minimizing the substrate dependency.

Component (D), Component (E)

The component (D) is preferably an amine, and most preferably a secondary or tertiary aliphatic lower amine.

Suitable examples include diethylamine, trimethylamine, n-propylamine, di-n-propylamine, tri-n-propylamine, triisopropanolamine, isopropylamine, tributylamine, tripentylamine, triethanolamine, dipropanolamine and tripropanolamine. Of these, the tertiary aliphatic lower amines are preferred.

There are no particular restrictions on the organic carboxylic acid of the component (E), and examples include saturated or unsaturated aliphatic carboxylic acids, alicyclic carboxylic acids and aromatic carboxylic acids.

Specific examples of saturated aliphatic carboxylic acids include monovalent and polyvalent carboxylic acids such as formic acid, acetic acid, propionic acid, butyric acid, isobutyric acid, oxalic acid, malonic acid, succinic acid, glutaric acid, and adipic acid.

Specific examples of unsaturated aliphatic carboxylic acids include acrylic acid, crotonic acid, isocrotonic acid, 3-butenoic acid, methacrylic acid, 4-pentenoic acid, propiolic acid, 2-butynoic acid, maleic acid, fumaric acid, and acetylenecarboxylic acid. Specific examples of alicyclic carboxylic acids include 1,1-cyclohexanedicarboxylic acid, 1,2-cyclohexanedicarboxylic acid, 1,3-cyclohexanedicarboxylic acid, 1,4-cyclohexanedicarboxylic acid, and 1,1-cyclohexyldiacetic acid.

Specific examples of aromatic carboxylic acids include aromatic carboxylic acids containing one or more hydroxyl group, nitro group or carboxyl group substituents such as p-hydroxybenzoic acid, o-hydroxybenzoic acid, 2-hydroxy-3-nitrobenzoic acid, phthalic acid, terephthalic acid, and isophthalic acid.

Examples of suitable phosphorus oxo acids or derivatives thereof include phosphoric acid or phosphorus acid or derivatives thereof such as esters, including phosphoric acid, phosphorus acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate and dibenzyl phosphonate; and phosphinic acid or derivatives thereof such as esters, including phosphinic acid and phenylphosphinic acid, although this is not a restrictive list.

The quantity added of the component (D) is typically within a range from 0.01 to 5.0 parts by weight, and preferably from 0.05 to 3.0 parts by weight, per 100 parts by weight of the component (A). Quantities within this range are preferred as they produce the best improvements in resist pattern shape and sensitivity.

The quantity added of the organic carboxylic acid, or phosphorus oxo acid or derivative thereof of the component (E) is typically within a range from 0.01 to 5.0 parts by weight, and preferably from 0.05 to 3.0 parts by weight, per 100 parts by weight of the component (A). Quantities within this range are preferred as they produce the best improvements in resolution and sensitivity.

Other miscible additives can also be added to a positive resist composition of the present invention according to need, and examples include halation prevention agents and surfactants.

A positive resist composition according to the present invention is preferably used in the form of a solution, produced by dissolving the components described above in a suitable solvent.

As the organic solvent, any of the solvents typically used for conventional positive resist compositions can be used. Specific examples of the solvent include ketones such as acetone, methyl ethyl ketone, cyclohexanone, methyl isoamyl ketone and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or the monomethyl ether, monoethyl ether, monopropyl ether, monobutyl ether or monophenyl ether of these polyhydric alcohols; cyclic ethers such as dioxane; and esters such as ethyl lactate, methyl acetate, ethyl acetate, butyl acetate, methyl pyruvate, ethyl pyruvate, methyl methoxypropionate, and ethyl ethoxypropionate.

These organic solvents can be used singularly, or as a mixed solvent containing two or more different solvents.

There are no particular restrictions on the quantity of solvent used, and the quantity can be set in accordance with the desired resist film thickness, within a range that makes it possible to generate a composition with a concentration that is suitable for application to the substrate. Solvent quantities that generate a solid fraction concentration for the composition within a range from 2 to 20% by weight, and preferably from 5 to 15% by weight, are ideal.

[Method of Forming a Resist Pattern]

A method of forming a resist pattern according to the present invention can be conducted in the manner described below.

Namely, a positive resist composition described above is first applied to the surface of a substrate such as a silicon wafer using a spinner or the like, and a prebake (PB) is then conducted under temperature conditions of 80 to 150° C. for 40 to 120 seconds, and preferably for 60 to 90 seconds, thereby forming a resist film. Following selective exposure of the resist film with a KrF excimer laser through a desired mask pattern using, for example, a KrF exposure apparatus, PEB (post exposure baking) is conducted under temperature conditions of 80 to 150° C. for 40 to 120 seconds, and preferably for 60 to 90 seconds. Subsequently, developing is conducted using an alkali developing solution such as an aqueous solution of tetramethylammonium hydroxide with a concentration of 0.1 to 10% by weight. In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure, and an ArF excimer laser, a KrF excimer laser, a $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly effective for KrF excimer lasers.

A positive resist composition and a method of forming a resist pattern according to the present invention enable a favorable resolution to be achieved. For example, the type of very fine pattern required for use with a short wavelength light source such as a KrF excimer laser can be resolved. Specifically, in the case of a L&S (line and space) pattern, patterns with a width of no more than 300 nm, and preferably with a width of approximately 200 nm, can be resolved.

In addition, reductions in both the LER of the pattern and the level of defects can also be achieved. Accordingly, the problems associated with very fine patterns can be resolved, which is extremely beneficial in the move towards higher levels of integration. The exposure margin is also favorable.

The reason that the present invention enables a favorable resolution to be obtained is unclear, although it is surmised that one important factor is that because the solubility rate is small, the difference between the solubility of the unexposed portions and the solubility of the exposed portions caused by the action of the component (C) is more pronounced. Furthermore, because the structural unit (a2) comprises an alcohol based hydroxyl group, the exposed portions display good affinity with the alkali developing solution, and are therefore dissolved readily. It is thought that this fact also contributes to an improvement in the resolution through an improvement in the solubility contrast. Furthermore, it is also thought that because the structural unit (a2) contains no benzene rings, these units are capable of improving the transparency of the component (A) relative to the KrF excimer laser radiation. It is considered that this improvement in transparency is another factor in improving the resolution.

Furthermore, in terms of the observed reductions in LER and defects, it is thought that the combination of the fact that, as described above, the exposed portions display good solubility in the alkali developing solution, and the fact that the component (A) is not protected with acid dissociable, dissolution inhibiting groups, means that when the resist is rinsed with pure water or the like following developing in the alkali developing solution, pH shock is less likely to occur.

EXAMPLES

Example

The materials shown below in Table 1 were mixed together to produce a positive resist composition.

Abbreviations Used:
DMAc: dimethylacetamide
PGMEA: propylene glycol monomethyl ether acetate
EL: ethyl lactate
DI: the compound according to the above general formula (2A) in which R' represents a tert-butyloxycarbonylmethyl group.

The ratio between the structural units (a1) and (a2) within the component (A) (the hydrogenation rate) was determined by GPC at a wavelength of 248 nm.

The above positive resist composition was applied to a series of silicon substrates, a resist film was formed on each substrate under the conditions described below, and each film was then selectively exposed using a KrF excimer laser, forming a series of 1:1 L&S (line and space) patterns with line widths of no more than 300 nm (specifically, 300 nm, 250 nm, 240 nm, 230 nm, 220 nm, and 210 nm).

Resist film thickness: 4200 Å
PB/PEB=110° C. (60 seconds)/130° C. (60 seconds)
Exposure conditions: 0.50 NA/0.75 sigma When the solubility rate of the positive resist composition was measured, the result was 5 Å/second.

Inspection of the above patterns using a scanning electron microscope revealed that resolution had been achieved right down to the line width of 210 nm.

Furthermore, no LER was observed on the side walls of the patterns. The number of defects was also 0, indicating that defect occurrence is essentially non-existent.

When the value of Eth [for a L&S=300 nm: 300 nm, the minimum exposure dose required to enable the subsequent developing step to completely remove the exposed portions of the resist film, thus exposing the underlying substrate] was determined, the result was 7 mJ.

Furthermore, when the value of EOP [for a L&S=300 nm: 300 nm, the optimum exposure dose for producing a 1:1 L&S ratio] was determined, the result was 16 mJ.

Larger values for the difference between Eth and EOP (9 mJ in this example) indicate a greater exposure margin.

TABLE 1

|  | Example | Comparative example 1 |
| --- | --- | --- |
| Component (A) | weight average molecular weight = 12,000<br>polydispersity = 1.16<br>structural unit (a1)*[3]: 61 mol %<br>structural unit (a2)*[3]: 39 mol %<br>100 parts by weight<br>solubility rate of resin: 200 Å/second | weight average molecular weight = 12,000<br>polydispersity = 1.1<br>A mixed resin comprising:<br>EV resin*[1]: 70 parts by weight, and<br>t-boc resin*[2]: 30 parts by weight<br>solubility rate of mix. resin: 5 Å/second |
| Component (B) | triphenylsulfonium<br>trifluoromethanesulfonate: 4 parts by weight | bis(cyclohexylsulfonyl)diazomethane:<br>6 parts by weight |
| Component (D) | triethanolamine: 0.2 parts by weight | salicylic acid: 0.23 parts by weight, |
| Component (E) |  | triethylamine: 0.11 parts by weight |
| Component (C) | DI: 10 parts by weight | none |
| Additives | none | DMAc: 5 parts by weight |
| Solvent | EL: 750 parts by weight | PGMEA: 700 parts by weight |

*[1]: a polyhydroxystyrene resin with a weight average molecular weight of 12,000 and a polydispersity of 1.1, in which the hydrogen atom of the hydroxyl group from 36 mol % of the hydroxystyrene units has been substituted with an ethoxyethyl group.
*[2]: a polyhydroxystyrene resin with a weight average molecular weight of 12,000 and a polydispersity of 1.1, in which the hydrogen atom of the hydroxyl group from 39 mol % of the hydroxystyrene units has been substituted with a tert-butoxycarbonyl group.
*[3]: Compounds of the general formula (1) and (2) in which R is a hydrogen atom, and the hydroxyl group is bonded at the para position.

Comparative Example 1

The materials shown above in Table 1 were mixed together to produce a positive resist composition.

With the exception of changing the PB and PEB conditions as shown below, resist film formation, exposure, and subsequent evaluations were performed in the same manner as the above example.

PB/PEB=90° C. (90 seconds)/110° C. (90 seconds)

The solubility rate of the positive resist composition was 5 Å/second, the same value as the above example.

Inspection of the produced L&S patterns using a scanning electron microscope revealed that resolution was only possible down to a line width of 230 nm. Furthermore, LER was observed on the side walls of the patterns. Furthermore, 60 defects were also counted.

The value of Eth was 7 mJ, and the value of EOP was 14 mJ. The difference between Eth and EOP was 7 mJ, a smaller value than that observed for the above example.

Comparative Example 2

A three component resist composition was formed using a polyhydroxystyrene with the same weight average molecular weight and the same polydispersity as the example 1 but with a solubility rate of 10,000 Å/second, an acid generator and the aforementioned DI, but a fine pattern was unable to be resolved.

From the results of the above example and comparative examples it is clear that by using a positive resist composition of the present invention, a superior resolution, and reduced levels of LER and defects can be achieved.

Furthermore, a favorable exposure margin can also be obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a resin component (A) which is not protected with an acid dissociable, dissolution inhibiting group, an acid generator component (B) that generates acid on exposure, and a compound (C), which contains at least one acid dissociable, dissolution inhibiting group, and which under action of said acid generated from said component (B), undergoes dissociation of said dissolution inhibiting group, thus generating an organic carboxylic acid, wherein said component (A) comprises a structural unit (a1) derived from an (α-methyl)hydroxystyrene, represented by a general formula (1) shown below, and a structural unit (a2) represented by a general formula (2) shown below:

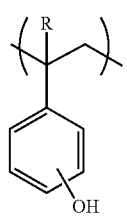

(1)

(wherein, R represents a hydrogen atom or a methyl group),

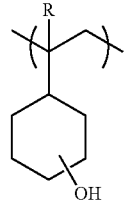

(2)

(wherein, R represents a hydrogen atom or a methyl group), wherein a solubility rate of said component (A) in a 2.38% by weight aqueous solution of TMAH (tetramethylammonium hydroxide) is within a range from 100 to 1000 Å/second.

2. A positive resist composition according to claim 1, wherein said component (C) is a compound with a weight average molecular weight within a range from 100 to 1500.

3. A positive resist composition according to claim 1, wherein said component (C) is a compound represented by a general formula (i) shown below wherein a hydrogen atom of at least one hydroxyl group or carboxyl group is substituted with an acid dissociable, dissolution inhibiting group:

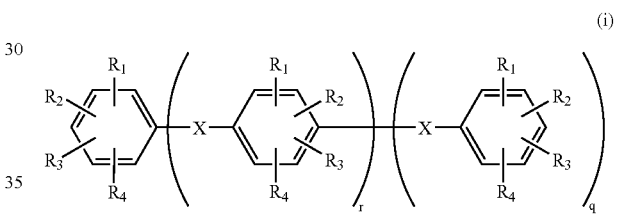

(i)

wherein, $R_1$ to $R_4$ each represent, independently, a hydrogen atom, a straight chain, branched, or cyclic alkyl group of no more than 6 carbon atoms, a lower alkoxy group, a hydroxyl group, a carboxyl group, or an alkyl group that contains a carboxyl group, provided that at least one of said groups $R_1$ to $R_4$ represents a hydroxyl group or a carboxyl group, each X represents, independently, a single bond, —C(O)— or —C($R_5$)($R_6$)—, $R_5$ represents a hydrogen atom or a lower alkyl group, $R_6$ represents a hydrogen atom, a lower alkyl group, a carboxyl group, an alkyl group that contains a carboxyl group, or an aryl group represented by a general formula (ii) shown below:

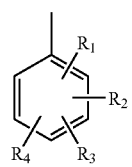

(ii)

wherein, groups $R_1$ to $R_4$ within said formula (ii) are as defined above, r represents a number from 0 to 2, and q represents either 0 or 1, although in cases where q is 0, a group inside parentheses is a hydrogen atom.

4. A positive resist composition according to claim 3, wherein said component (C) is a compound represented by a general formula (1A) shown below:

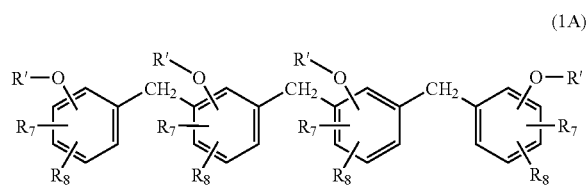
(1A)

(wherein, each R' represents an acid dissociable, dissolution inhibiting group, and $R_7$ and $R_8$ each represent, independently, a hydrogen atom or a lower alkyl group).

5. A positive resist composition according to claim 4, wherein said component (C) is a compound represented by a general formula (2A) shown below:

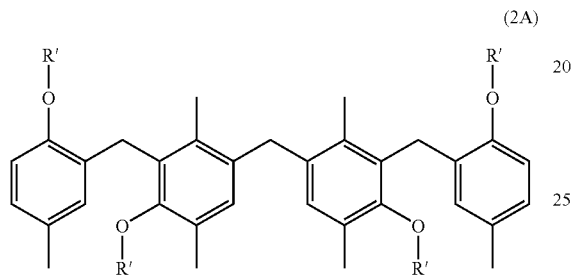
(2A)

(wherein, each R' represents an acid dissociable, dissolution inhibiting group).

6. A method of forming a resist pattern, comprising the steps of:
applying a positive resist composition according to claim 5 to a surface of a substrate;
conducting a prebake under temperature conditions of 80 to 150° C. to form a resist film;
exposing the resist film with a laser through a desired mask pattern;
conducting a post exposure baking to the exposed resist film under temperature conditions of 80 to 150° C.; and
developing the resultant resist film using an alkali developing solution to form a resist pattern.

7. A positive resist composition according to claim 3, wherein said acid dissociable, dissolution inhibiting group is at least one group selected from a group consisting of tertiary alkoxycarbonyl groups, tertiary alkoxycarbonylalkyl groups, tertiary alkyl groups, cyclic ether groups, alkoxyalkyl groups and 1-alkylcycloalkyl groups.

8. A positive resist composition according to claim 7, wherein said acid dissociable, dissolution inhibiting group is at least one group selected from a group consisting of a tert-butyloxycarbonyl group, tert-butyloxycarbonylmethyl group, tert-butyl group, tetrahydropyranyl group, ethoxyethyl group, 1-methylcyclohexyl group and 1-ethylcyclohexyl group.

9. A positive resist composition according to claim 8, wherein said acid dissociable, dissolution inhibiting group is a tert-butyloxycarbonylmethyl group.

10. A positive resist composition according to claim 3, wherein the quantity added of said component (C) is within a range from 5 to 40 parts by weight per 100 parts by weight of said component (A).

11. A positive resist composition according to claim 1, wherein in said component (A), said structural unit (a1) accounts for 40 to 95 mol %, and said structural unit (a2) accounts for 5 to 60 mol %.

12. A positive resist composition according to claim 1, further comprising a nitrogen containing organic compound (D).

13. A positive resist composition according to claim 1, wherein said acid generator component (B) is an onium salt represented by the general formula (III), (IV), (V) or (VI) shown below:

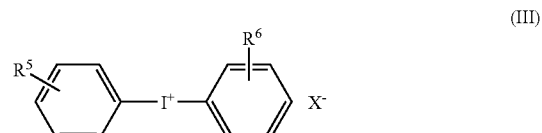
(III)

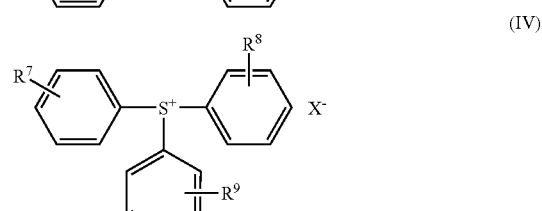
(IV)

(V)

(VI)

wherein, $R^5$, $R^6$, $R^7$, $R^8$ and $R^9$ each represent, independently, a hydrogen atom, an alkyl group of 1 to 4 carbon atoms, or an alkoxy group of 1 to 2 carbon atoms, $R^{10}$ represents an alkyl group of 1 to 4 carbon atoms, and $X^-$ represents a fluoroalkylsulfonate ion.

14. A positive resist composition according to claim 13, wherein the quantity added of said component (B) is within a range from 0.5 to 20 parts by weight per 100 parts by weight of said component (A).

15. A method of forming a resist pattern, comprising the steps of:
applying a positive resist composition according to claim 1 to a surface of a substrate;
conducting a prebake under temperature conditions of 80 to 150° C. to form a resist film;
exposing the resist film with a laser through a desired mask pattern;
conducting a post exposure baking to the exposed resist film under temperature conditions of 80 to 150° C.; and
developing the resultant resist film using an alkali developing solution to form a resist pattern.

* * * * *